US009397096B2

(12) United States Patent
Zhu

(10) Patent No.: US 9,397,096 B2
(45) Date of Patent: Jul. 19, 2016

(54) SEMICONDUCTOR DEVICE AND METHOD FOR MANUFACTURING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 2 days.

(21) Appl. No.: 14/440,463

(22) PCT Filed: Nov. 19, 2012

(86) PCT No.: PCT/CN2012/084814
§ 371 (c)(1),
(2) Date: May 4, 2015

(87) PCT Pub. No.: WO2014/071650
PCT Pub. Date: May 15, 2014

(65) Prior Publication Data
US 2015/0303192 A1    Oct. 22, 2015

(30) Foreign Application Priority Data
Nov. 9, 2012    (CN) .......................... 2012 1 0447834

(51) Int. Cl.
*H01L 21/76*    (2006.01)
*H01L 27/088*    (2006.01)
(Continued)

(52) U.S. Cl.
CPC ...... *H01L 27/0886* (2013.01); *H01L 21/02274* (2013.01); *H01L 21/02532* (2013.01);
(Continued)

(58) Field of Classification Search
CPC ..................... H01L 21/30604; H01L 21/3111; H01L 21/823431; H01L 21/823481; H01L 21/823821; H01L 27/0886; H01L 21/02274
USPC ......................................................... 438/424
See application file for complete search history.

(56) References Cited

U.S. PATENT DOCUMENTS 8,283,653 B2    10/2012    Pillarisetty et al.
8,440,517 B2    5/2013    Lin et al.
(Continued)

FOREIGN PATENT DOCUMENTS

CN    102446974 A    5/2012
CN    102656699 A    9/2012

OTHER PUBLICATIONS

International Search Report as issued in International Patent Application No. PCT/CN2012/084814, dated Aug. 22, 2013.
(Continued)

Primary Examiner — Bradley K Smith
(74) Attorney, Agent, or Firm — Pillsbury Winthrop Shaw Pittman LLP

(57) ABSTRACT

A semiconductor device and a method for manufacturing the same, wherein an example method may include: forming a first semiconductor layer and a second semiconductor layer sequentially on a substrate; patterning the second semiconductor layer to form an initial fin; performing anisotropic etching on the first semiconductor layer to form a Σ-shaped lateral recess therein; forming an isolation layer on the substrate to have a portion that fills the lateral recess, wherein the isolation layer, except the portion that fills the lateral recess, has a top surface located between a top surface and a bottom surface of the first semiconductor layer, and thus defines a fin above the isolation layer; and forming a gate stack intersecting the fin on the isolation layer.

14 Claims, 10 Drawing Sheets

(51) Int. Cl.

| | |
|---|---|
| *H01L 21/8238* | (2006.01) |
| *H01L 27/092* | (2006.01) |
| *H01L 21/02* | (2006.01) |
| *H01L 21/265* | (2006.01) |
| *H01L 21/306* | (2006.01) |
| *H01L 21/311* | (2006.01) |
| *H01L 21/8234* | (2006.01) |
| *H01L 29/06* | (2006.01) |
| *H01L 29/16* | (2006.01) |
| *H01L 29/161* | (2006.01) |
| *H01L 29/78* | (2006.01) |

(52) U.S. Cl.
CPC ........ *H01L21/265* (2013.01); *H01L 21/30604* (2013.01); *H01L 21/31111* (2013.01); *H01L 21/823431* (2013.01); *H01L 21/823481* (2013.01); *H01L 21/823821* (2013.01); *H01L 21/823878* (2013.01); *H01L 27/0924* (2013.01); *H01L 29/0653* (2013.01); *H01L 29/16* (2013.01); *H01L 29/161* (2013.01); *H01L 29/785* (2013.01); *H01L 29/0673* (2013.01)

(56) References Cited

U.S. PATENT DOCUMENTS

| | | | | |
|---|---|---|---|---|
| 8,575,596 | B2 | 11/2013 | Pillarisetty et al. | |
| 8,809,940 | B2 | 8/2014 | Lin et al. | |
| 2004/0150029 | A1 | 8/2004 | Lee | |
| 2012/0161238 | A1* | 6/2012 | Scheiper | H01L 21/823412 257/368 |
| 2014/0057404 | A1* | 2/2014 | Qin | H01L 21/30604 438/285 |
| 2014/0346600 | A1* | 11/2014 | Cheng | H01L 29/7849 257/347 |
| 2014/0357041 | A1* | 12/2014 | Ding | H01L 29/66795 438/299 |
| 2015/0137139 | A1* | 5/2015 | Hirler | H01L 21/8258 257/76 |

OTHER PUBLICATIONS

Written Opinion of the International Searching Authority as issued in International Patent Application No. PCT/CN2012/084814, dated Aug. 22, 2013.

* cited by examiner

SEMICONDUCTOR DEVICE AND METHOD FOR MANUFACTURING THE SAME

CROSS-REFERENCE TO RELATED APPLICATION

This application is a U.S. national phase application of PCT Patent Application No. PCT/CN2012/084814, filed on Nov. 19, 2012, which claims priority to Chinese Patent Application No. 201210447834.8, filed on Nov. 9, 2012, entitled "Semiconductor Device and Method for Manufacturing the Same," which is incorporated herein by reference in its entirety.

TECHNICAL FIELD

The present disclosure relates to semiconductor technology, and particularly to semiconductor devices and methods for manufacturing the same.

BACKGROUND

Short channel effects are getting more significant as planar semiconductor devices are increasingly being scaled down. To this end, three-dimensional (3D) semiconductor devices, such as Fin Field Effect Transistors (FinFETs), have been proposed. Generally, a FinFET includes a fin formed vertically on a substrate and a gate stack intersecting the fin. As such, a channel is formed in the fin, and has a width defined basically by a height of the fin. Unfortunately, it is difficult to control fins formed on a wafer to have the same height during manufacture of an integrated circuit (IC), resulting in inconsistency in performance of devices across the wafer.

On the other hand, a parasitic capacitance is formed at the bottom of the fin due to dielectric between the gate and the body. If the parasitic capacitance is too large, the response time of the device will become too long.

SUMMARY OF THE DISCLOSURE

The present disclosure aims to provide, among others, a semiconductor device and a method for manufacturing the same.

According to an aspect of the present disclosure, there is provided a method for manufacturing a semiconductor device, comprising: forming a first semiconductor layer and a second semiconductor layer sequentially on a substrate; patterning the second semiconductor layer to form an initial fin; performing anisotropic etching on the first semiconductor layer to form a sigma-($\Sigma$)-shaped lateral recess therein; forming an isolation layer on the substrate, wherein the isolation layer has a portion that fills the lateral recess, and wherein the isolation layer, except the portion that fills the lateral recess, has a top surface located between a top surface and a bottom surface of the first semiconductor layer, and thus defines a fin above the isolation layer; and forming a gate stack intersecting the fin on the isolation layer.

According to another aspect of the present disclosure, there is provided a semiconductor device, comprising: a substrate; patterned first and second semiconductor layers sequentially formed on the substrate, wherein the first semiconductor layer includes a $\Sigma$-shaped lateral recess relative to the second semiconductor layer; an isolation layer formed on the substrate, wherein the isolation layer has a portion that fills the lateral recess, and wherein the isolation layer, except the portion that fills the lateral recess, has a top surface lower than a top surface of the first semiconductor layer but higher than a bottom surface of the first semiconductor layer, and thus defines a fin above the isolation layer; and a gate stack formed on the isolation layer and intersecting the fin.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
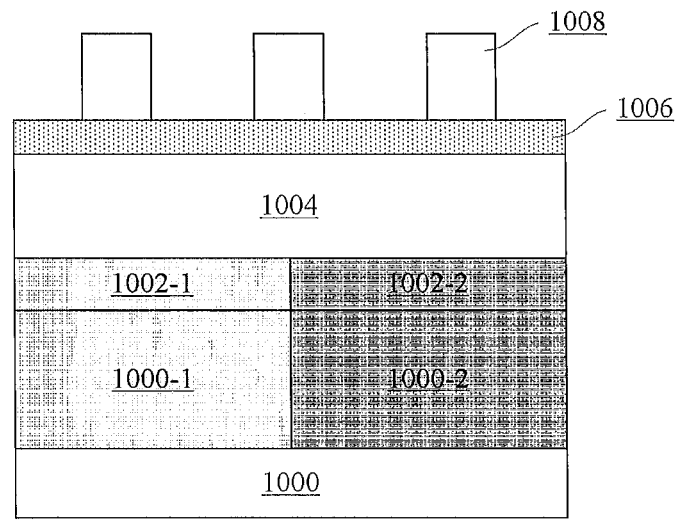
FIGS. 1 to 15 are schematic diagrams showing a flow for manufacturing a semiconductor device according to an embodiment of the present disclosure.

Hereinafter, the technology disclosed herein is described with reference to embodiments thereof shown in the attached drawings. However, it should be noted that those descriptions are just provided for illustrative purpose, rather than limiting the present disclosure. Further, in the following, descriptions of known structures and techniques are omitted so as not to obscure the concept of the present disclosure.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacturing tolerances or technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to an embodiment of the present disclosure, at least one semiconductor layer may be formed on a substrate by, for example, epitaxy. As such, in order to form fins having the same height during patterning the fins by, for example, etching, a depth by which the etching is performed into the substrate may be reduced as compared with the conventional technology (the depth may even be reduced to zero; in this case, the fins are formed entirely by the at least one semiconductor layer), and thus it is easier to control the etching depth to be consistent. Further, it is relatively easier to control the epitaxial layer to be uniform in thickness. As a result, it is possible to improve uniformity in thickness for the finally-formed fins.

In a preferable embodiment of the present disclosure, the at least one semiconductor layer includes two or more semiconductor layers, among which adjacent semiconductor layers may have etching selectivity with respect to each other. Therefore, it is possible to selectively etch each of the semiconductor layers. After forming the fin, one (or more) of the semiconductor layers may be selectively etched to be narrowed (recessed) in a lateral direction. In particular, a $\Sigma$-shaped lateral recess may be formed by anisotropic etching. Such a $\Sigma$-shaped lateral recess facilitates reducing inconsistency in processes due to etching the recess.

In addition, an isolation layer is formed in such way that the isolation layer may have a portion that fills the lateral recess, but still make a portion of the narrowed (recessed) one (or more) layer protrude (relative to a top surface of the isolation layer). Therefore, the narrowed (recessed) one (or more) layer is located at the bottom of the finally-formed fin (a portion of the initially-formed fin beneath the one or more layers is surrounded by the isolation layer, and thus does not act as a true fin where a channel is to be formed).

In this way, at the bottom of the finally-formed fin, a portion of the isolation layer between a subsequently-formed gate and the fin is relatively thick due to the lateral recess, and thus a resultant parasitic capacitance is relatively small.

According to an embodiment of the present disclosure, the isolation layer may be formed by depositing a dielectric layer on the substrate and then etching it back. The dielectric layer may substantially cover the initially-formed fin, and a portion of the dielectric layer on top of the initial fin may have a thickness sufficiently less than that of a portion of the dielectric layer on the substrate. For example, the portion of the dielectric layer on top of the initial fin may have a thickness less than ⅓, preferably ¼, of the thickness of the portion of the dielectric layer on the substrate. This may be implemented by, for example, high density plasma (HDP) deposition. In case of forming a plurality of initial fins, a portion of the dielectric layer on top of each of the initial fins may have a thickness less than half of a spacing between the fin and its neighboring fin. As such, an etching depth may be reduced in the subsequent back-etching, and thus accuracy for controlling the etching may be improved.

The present disclosure may be presented in various forms, and some examples thereof will be described hereafter.

As shown in FIG. 1, a substrate 1000 is provided. The substrate 1000 may comprise any suitable substrate in various forms, for example, but not limited to, bulk semiconductor substrate, such as bulk Si substrate, semiconductor-on-insulator (SOI) substrate, SiGe substrate and the like. In the following, a bulk Si substrate is described by way of example for convenience of description. In an embodiment of the present disclosure, the substrate 1000 has a [100] orientated surface.

An n-type well 1000-1 and a p-type well 1000-2 may be formed in the substrate 1000, so that a p-type device and an n-type device may be formed later therein, respectively. For example, the n-type well 1000-1 may be formed by implanting n-type impurities (such as P or As) into the substrate 1000, and the p-type well 1000-2 may be formed by implanting p-type impurities (such as B) into the substrate 1000. If required, annealing may be performed after the implantation. To those skilled in the art, the n-type and p-type wells may be formed in various methods, and detailed descriptions thereof will be omitted here.

It is to be noted that a process of forming complementary devices in the respective n-type and p-type wells will be described below, but the present disclosure is not limited thereto. The present disclosure is also applicable to a non-complementary process, for example. Further, some of the following processes related to the complementary devices may be not necessary in some implementations.

A first semiconductor layer 1002 may be formed on the substrate 1000 by, for example, epitaxy. In an example, the first semiconductor layer 1002 may comprise SiGe (wherein Ge may have an atomic percentage of about 5-20%), with a thickness of about 10-50 nm. In an embodiment of the present invention, the first semiconductor layer 1002 may have a [100] orientated surface. The first semiconductor layer 1002 may be doped in-situ while being grown, for example, into p-type by using B. The first semiconductor layer may have a doping concentration higher than that of the underlying p-type well, for example, 1E18-2E19 cm$^{-3}$. In an example, the first semiconductor layer 1002 of p-type may be implanted with C in order to reduce B diffusion.

A portion of the first semiconductor layer on the p-type well may be shielded by photoresist (not shown), and a portion of the first semiconductor layer on the n-type well may be implanted with n-type impurities, such as As or P, and thus converted into n-type, with a doping concentration higher than that of the underlying n-type well, for example, 2E18-4E19 cm$^{-3}$. The photoresist may be then removed. As such, a first n-type semiconductor layer 1002-1 and a first p-type semiconductor layer 1002-2 are formed.

Next, a second semiconductor layer 1004 may be formed on the first semiconductor layer 1002 (including 1002-1 and 1002-2) by, for example, epitaxy. The second semiconductor layer 1004 may include Si, with a thickness of about 20-100 nm.

In another embodiment of the present disclosure, the first semiconductor layer 1002 may comprise Si, and may be doped similarly as described above. Although the first semiconductor layer comprise the Si material like the underlying substrate and the overlying second semiconductor layer, some etching selectivity may be implemented therebetween due to differences in the doping concentration.

A protection layer 1006 may be formed on the second semiconductor layer 1004. For example, the protection layer 1006 may include oxide (for example, silicon oxide) with a thickness of about 10-50 nm. Such a protection layer 1006 can protect end portions of fins in subsequent processes.

Figure 2:
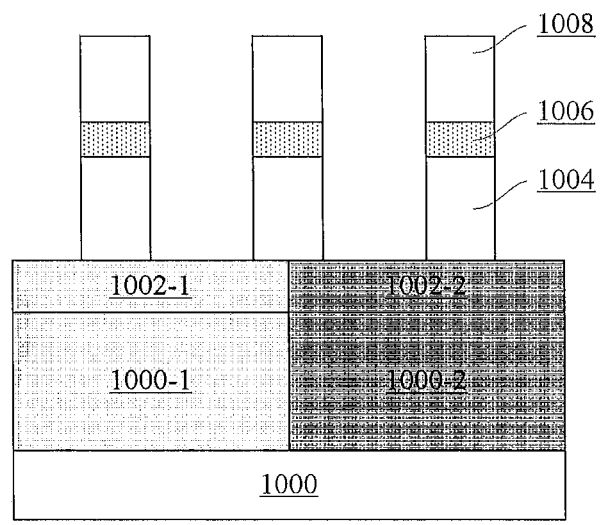

The formed second semiconductor layer 1004 may then be patterned to form initial fins. For example, this can be done as follows. In particular, photoresist 1008 may be formed and then patterned as designed on the protection layer 1006. The photoresist 1008 is generally patterned into a series of parallel equi-spaced lines. Then, as shown in FIG. 2, the protection layer 1006 and the second semiconductor layer 1004 may be sequentially selectively etched by, for example, reactive ion etching (RIE), with the patterned photoresist 1008 as a mask, thereby forming the initial fins. Then, the photoresist 1008 may be removed.

Although in the example of FIG. 2, trenches formed (between the initial fins) by the etching are shown in a regular rectangular shape, the disclosure is not limited thereto. For example, the trenches may have a tapered shape from top down. In addition, positions and number of the formed initial fins are not limited to the example shown in FIG. 2.

Figure 3:
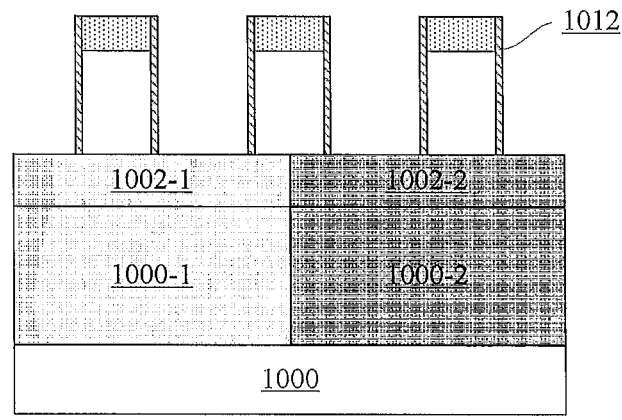

In order to reduce a parasitic capacitance at the bottom of finally formed fins, the first semiconductor layer 1002 may be selectively etched, to have a lateral recess relative to the second semiconductor layer 1004. In order to ensure that the initial fins are not damaged in a process of etching the first semiconductor layer 1002, a protection layer may be formed on side walls of the initial fins. Specifically, as shown in FIG. 3, a protection layer 1012 may be formed as spacers on the side walls of the initial fins. For example, the protection layer 1012 may comprise nitride (for example, silicon nitride) with a thickness of about 5-10 nm. In the example of FIG. 3, as the protection layer 1006 exists on top of the initial fins, the protection layer 1012 may be formed as spacers, instead of being formed on top of the initial fins. However, the present disclosure is not limited thereto, and a suitable protection layer 1012 may be formed in various ways.

Of course, if an etching agent for the first semiconductor layer has enough etching selectivity with respect to the second semiconductor and the substrate, the protection layer may be omitted.

In order to reduce variations in processes, a Σ-shaped lateral recess may be formed in the second semiconductor layer.

Figure 4:
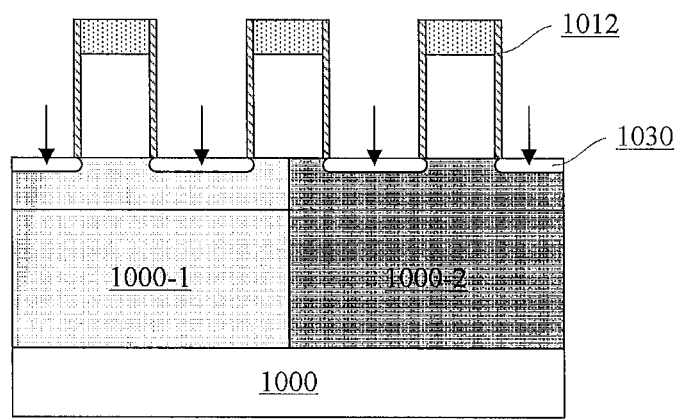
Figure 5:
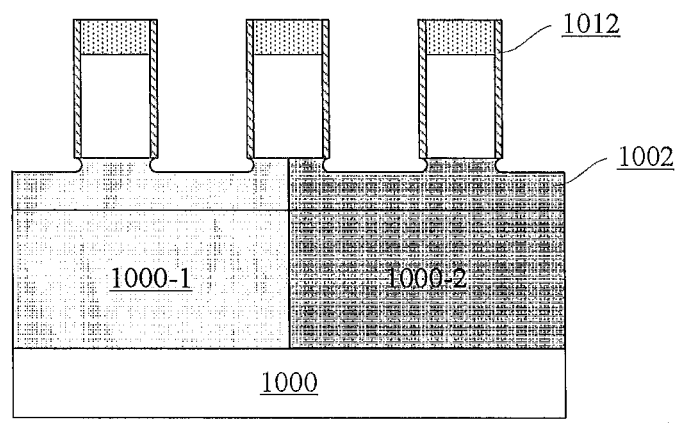
Figure 6:
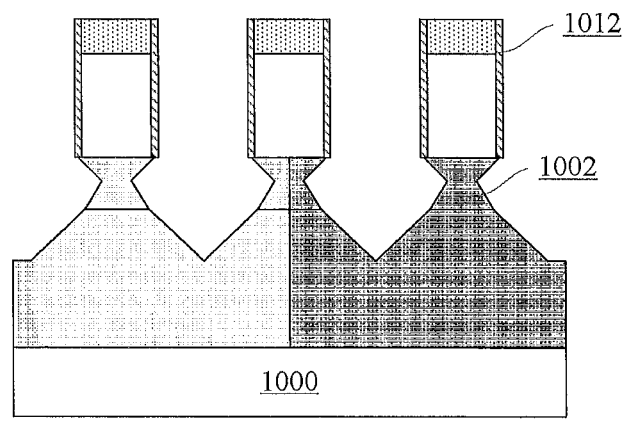

There are a variety of methods to form the Σ-shaped lateral recess in the art, and only an example thereof will be described below. Specifically, as shown in FIG. 4, non-crystallization regions 1030 are formed in the first semiconductor layer through ion implantation (as denoted by arrows in FIG. 4). Due to the existence of the initial fins, the non-crystallization regions 1030 are substantially located between adjacent initial fins; and due to diffusion, the non-crystallization regions 1030 slightly extend to beneath the fins, with a substantially C-shaped end face. For example, the ion implantation may be implemented by implanting Ge, with an implantation depth of about 5-10 nm at an implantation dose larger than about $3E14\ cm^{-2}$. Then, as shown in FIG. 5, the non-crystallization regions 1030 may be selectively etched with respect to crystal portions of the first semiconductor layer 1002, resulting in C-shaped lateral recesses in the first semiconductor layer 1002. Then, as shown in FIG. 6, anisotropic etching is further performed on the first semiconductor layer 1002 through the C-shaped lateral recesses and thus Σ-shaped lateral recesses are formed. For example, this anisotropic etching may be performed with a TMAH solution. In this case, the substrate is also etched to some extent. In an embodiment of the present invention, the Σ-shaped lateral recess has side surfaces along {111} crystal faces.

It is to be noted that the method to form the C-shaped lateral recess is not limited to the above example. For example, isotropic etching (for example, wet etching with an oxidant and HF-based acid solution, or isotropic dry etching), or anisotropic dry etching such as RIE and then isotropic dry etching, or the like is also feasible.

Figure 7:
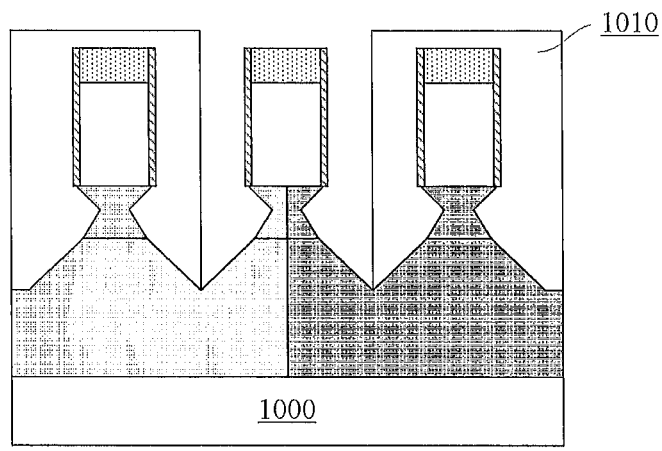

In addition, in case of the complementary process, an isolation may be formed between the n-type and p-type regions as shown in FIG. 7. In particular, photoresist 1010 may be formed on the substrate, and then patterned to expose a region around an interface between the n-type and p-type regions. Then, portions of the protection layer and the second and first semiconductor layers existing in this region are selectively etched by, for example, RIE. The substrate may be further selectively etched by, for example, RIE. As such, an isolation zone is formed between the n-type and p-type regions, and may subsequently be filled with dielectric. Then, the photoresist 1010 may be removed.

Figure 8:
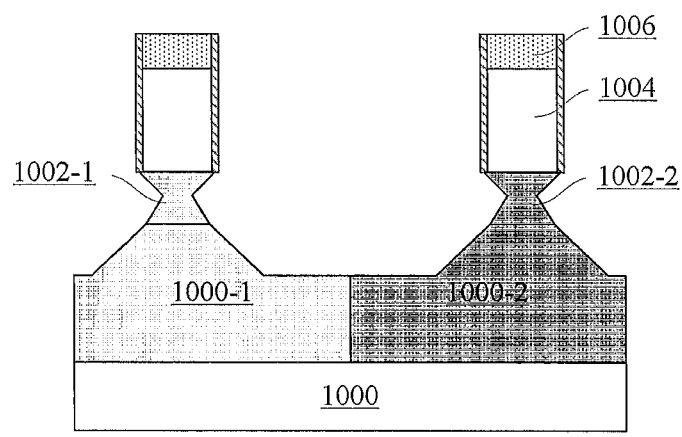

In the example of FIG. 2, an initial fin is also formed at the interface between the n-type well 1000-1 and the p-type well 1000-2. The initial fin is then removed by the isolation forming process of FIG. 7, resulting in the structure shown in FIG. 8.

After the fins having the lateral recesses are formed in the above process, gate stacks intersecting the fins may be formed to achieve final semiconductor devices.

To isolate the gate stacks from the substrate, an isolation layer may be formed on the substrate. This isolation layer may be formed by, for example, depositing a dielectric material on the substrate, and then etching it back. As such, the isolation layer will have a portion that fills the lateral recesses. In addition, in the back-etching, an etching depth may be controlled so that the back-etched dielectric material makes a portion of the first semiconductor layer protrude (relative to a top surface of the dielectric layer). That is, the isolation layer (except the portion filling the lateral recesses) has its top surface located beneath a top surface but above a bottom surface of the first semiconductor layer. In an example, the isolation layer may comprise High Density Plasma (HDP) oxide, such as silicon oxide.

Figure 9:
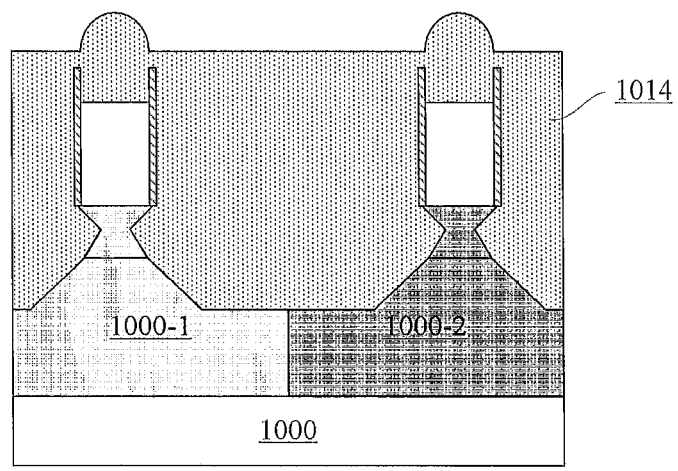

To improve uniformity in level of (the top surface of) the dielectric layer after being etched back, and thus improve uniformity in height of the finally-formed fins, a dielectric material 1014 may be deposited in such a way that it substantially covers the initial fin (i.e., in case of multiple initial fins, substantially fills up gaps between the initial fins), as shown in FIG. 9. According to embodiments of the present disclosure, the dielectric layer may be deposited such that a portion of the dielectric layer on top of the initial fins has a thickness sufficiently less than that of a portion of the dielectric layer on the substrate. In general, the thickness of the portion of the dielectric layer on top of the initial fins is less than ⅓, preferably ¼, of the thickness of the portion of the dielectric layer on the substrate. In an example, the portion of the dielectric layer on top of each of the initial fins may have a thickness no more than 20 nm, and the portion of the dielectric layer on the substrate may have a thickness up to about 100 nm.

According to an example of the present disclosure, the dielectric material 1014 may comprise oxide (e.g., silicon oxide) formed by High Density Plasma (HDP) deposition. Due to characteristics of HDP, the thickness of the dielectric layer on top of the initial fins (in a direction perpendicular to the substrate) and on side surfaces of the initial fins (in a direction parallel to the substrate, i.e., a lateral direction) is less than that of the dielectric layer between the initial fins on the substrate (in a direction perpendicular to the substrate) during the deposition. Due to such characteristics, the HDP deposition is conventionally not used to make oxide isolation.

Here, by controlling, for example, deposition conditions, the thickness of the portion of the dielectric layer 1014 on top of each of the initial fins may be less than ½ of a spacing between the initial fin and its neighboring fin when the dielectric layer 1014 substantially covers the initial fins (or substantially fills up the gaps between the initial fins). If spacings between the initial fins are not the same, the thickness of the portion of the dielectric layer 1014 on top of each of the initial fins may be less than ½ of a narrower one of the spacings between the initial fin and its neighboring fins.

Figure 10:
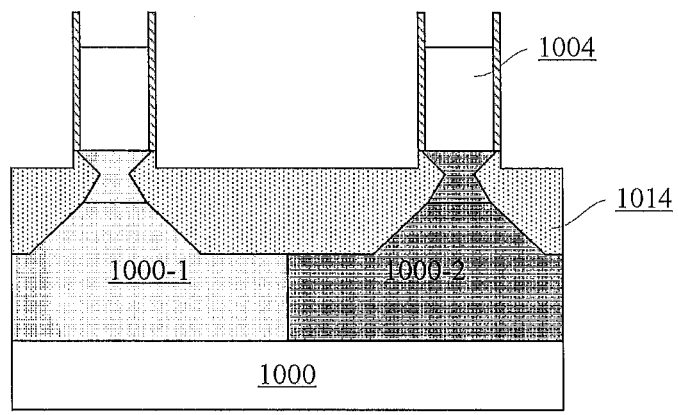

Next, the dielectric material 1014 is etched back as shown in FIG. 10. As the back-etching of the dielectric material 1014 is performed with a relatively small depth, it is relatively easy to control the etching, and it is thus possible to more accurately control a distance from the top surface of the fin (in this example, the top surface of the second semiconductor layer 1004) to the top surface of the isolation layer 1014 (which determines at least partially a fin height of the final device and thus a channel width of the final device), so that the distance is kept substantially constant across the substrate. In this way, the isolation layer may define the fins above the isolation layer. In an example where the first semiconductor layer 1002-1 and 1002-2 is doped as described above, it results in a threshold voltage higher than that in the second semiconductor layer 1004. Therefore, by controlling a gate control voltage, the second semiconductor layer may be conductive while the first semiconductor layer may not be conductive. As such, the fins used in the final devices may include only the second semiconductor layer 1004, and the first semiconductor layer may act as a punch-through stopper to prevent punch-through between source and drain.

In an example, the protection layer 1006 and the dielectric material 1014 comprise the same material, such as oxide. Therefore, in the process of etching back the dielectric material 1014, the protection layer 1006 may be removed at the same time, as shown in FIG. 10. Then, the protection layer 1012 may be removed.

Figure 11:
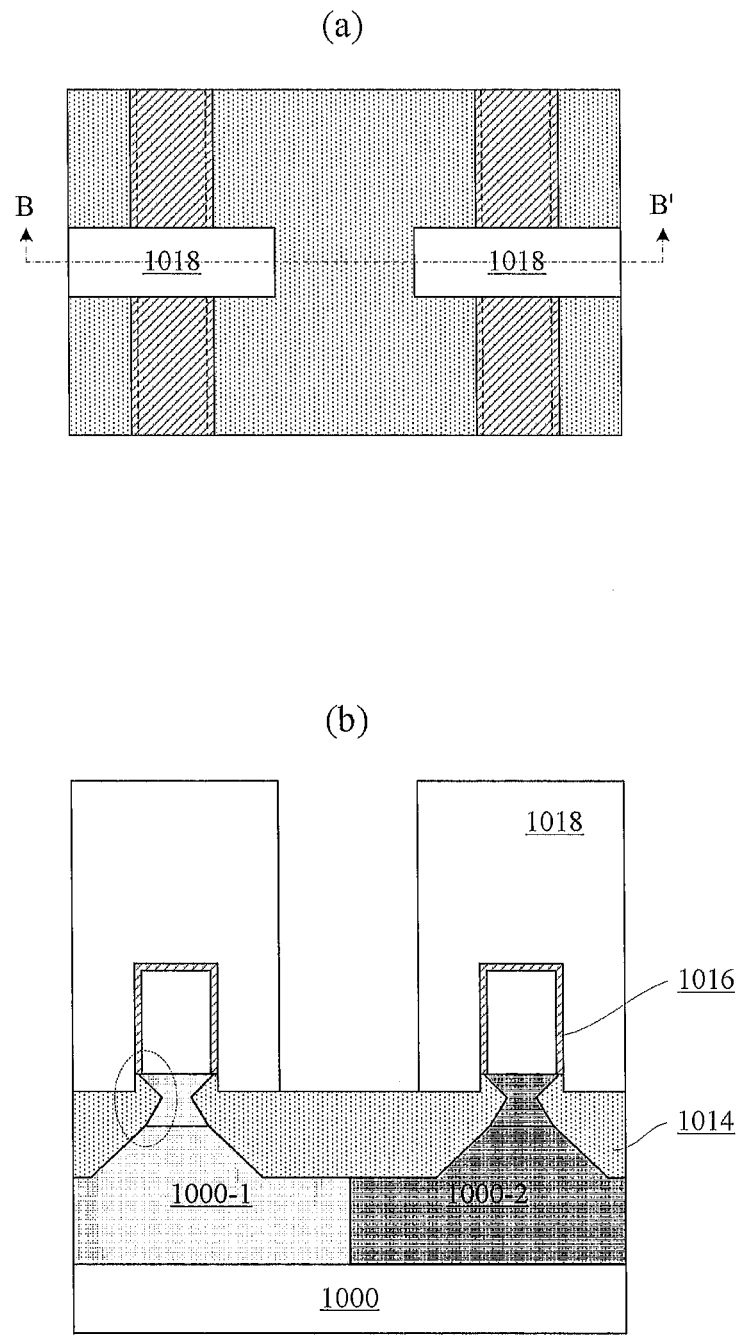

Then, gate stacks intersecting the respective fins may be formed on the isolation layer 1014. For example, this may be done as follows. In particular, as shown in FIG. 11 (FIG. 11(*b*) illustrates a cross-sectional view along line BB' in FIG. 11(*a*)), a gate dielectric layer 1016 may be formed through, for example, deposition. The gate dielectric layer 1016 may comprise, for example, oxide with a thickness of about 0.8-1.5 nm. Although the gate dielectric layer 1016 is shown in FIG. 11 as a shape of "Π," the gate dielectric layer 1016 may also include a portion extending onto the surface of the isolation layer 1014. Then, a gate conductor layer 1018 may be formed through, for example, deposition. The gate conductor layer 1018 may comprise, for example, polysilicon. The gate conductor layer 1018 may fill up the gaps between the fins, and may be planarized by, for example, chemical mechanical polishing (CMP). Next, the gate conductor layer 1018 is patterned to form the gate stacks. The gate conductor layer 1018 is patterned into strips intersecting the respective fins in the example of FIG. 11. In another embodiment, the gate dielectric layer 1016 may be further patterned with the patterned gate conductor layer 1018 as a mask.

As denoted by a dotted-line ellipse in FIG. 11(b), a relatively thick portion of the isolation layer 1014 exists between the bottom of the fin and the gate conductor 1018, resulting in a relatively small parasitic capacitance.

After forming the patterned gate conductor, halo implantation and extension implantation may be performed with the gate conductor as a mask, for example.

Figure 12:
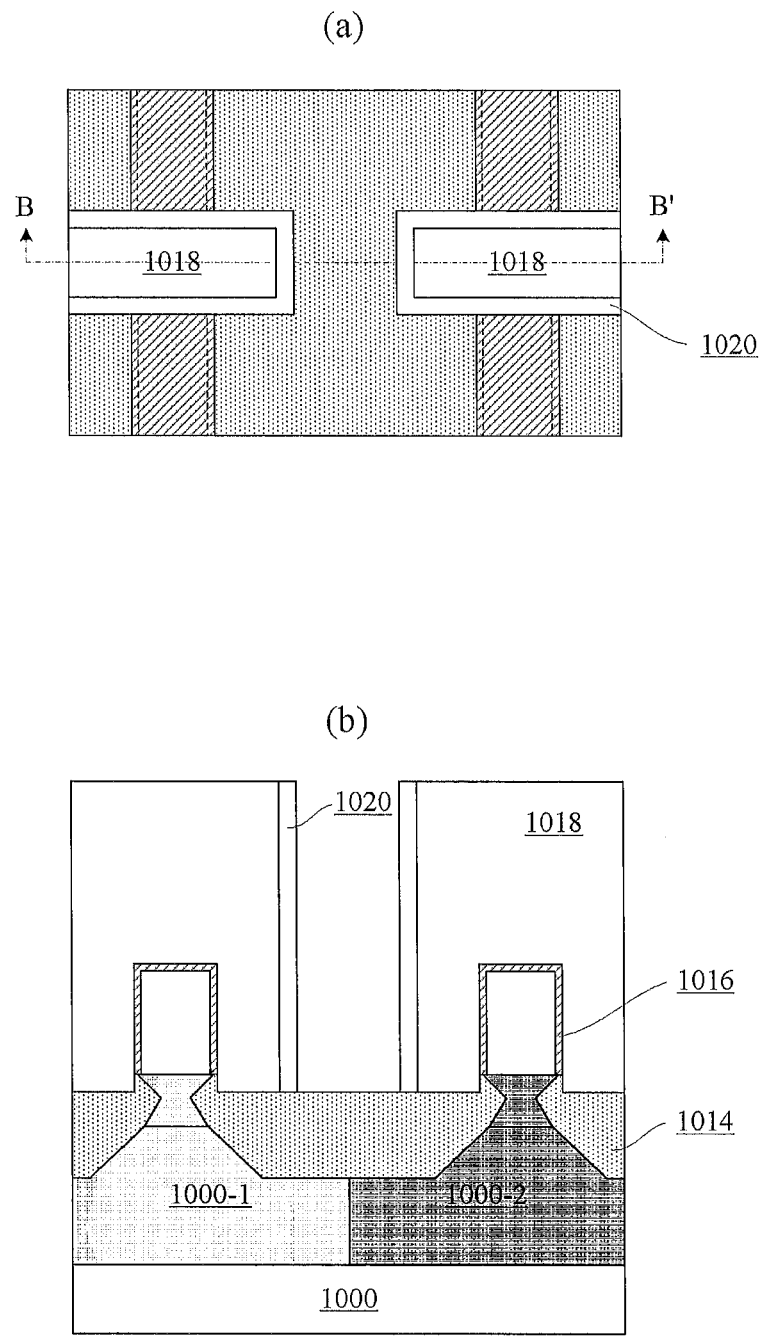

Next, as shown in FIG. 12 (FIG. 12(b) shows a cross-sectional view along line BB' in FIG. 12(a)), a spacer 1020 may be formed on side walls of the gate conductor layer 1018. The spacer 1020 may be formed by, for example, depositing a nitride layer with a thickness of about 5-30 nm, and then applying RIE on the nitride layer. There are various approaches for forming such a spacer, and details thereof will be omitted here.

The spacer 1020 includes substantially no portion formed on side walls of the fins when the trenches between the fins have a tapered shape narrowed from top down (it is generally the case due to characteristics of the etching).

After forming the spacer, source/drain (S/D) implantation may be performed with the gate conductor and the spacer as a mask. Then, the implanted ions may be activated through annealing to form source/drain regions, resulting in the semiconductor device of the embodiment. As shown in FIG. 12, the semiconductor device may comprise: the substrate; the patterned first and second semiconductor layers sequentially formed on the substrate, wherein the first semiconductor layer includes a Σ-shaped lateral recess relative to the second semiconductor layer; the isolation layer formed on the substrate, having a portion that fills the lateral recess, wherein the isolation layer, except the portion that fills the lateral recess, has a top surface lower than a top surface of the first semiconductor layer but higher than a bottom surface of the first semiconductor layer, and thus defines a fin above the isolation layer; and the gate stack formed on the isolation layer and intersecting the fin. For a p-type device, the first semiconductor layer may be doped with n-type impurities, while for an n-type device, the first semiconductor layer may be doped with p-type impurities. Such a doped first semiconductor layer may act as a punch-through stopper.

In the above embodiment, the gate stacks are formed directly after the formation of the fins. The present disclosure is not limited thereto, and the gate last process is also applicable.

In a further embodiment of the present disclosure, the gate dielectric layer 1016 and the gate conductor layer 1018 formed in FIG. 11 may be a sacrifice gate dielectric layer and a sacrifice gate conductor layer, respectively. Subsequent processes may be performed in the way described above in conjunction with FIGS. 11 and 12.

Figure 13:
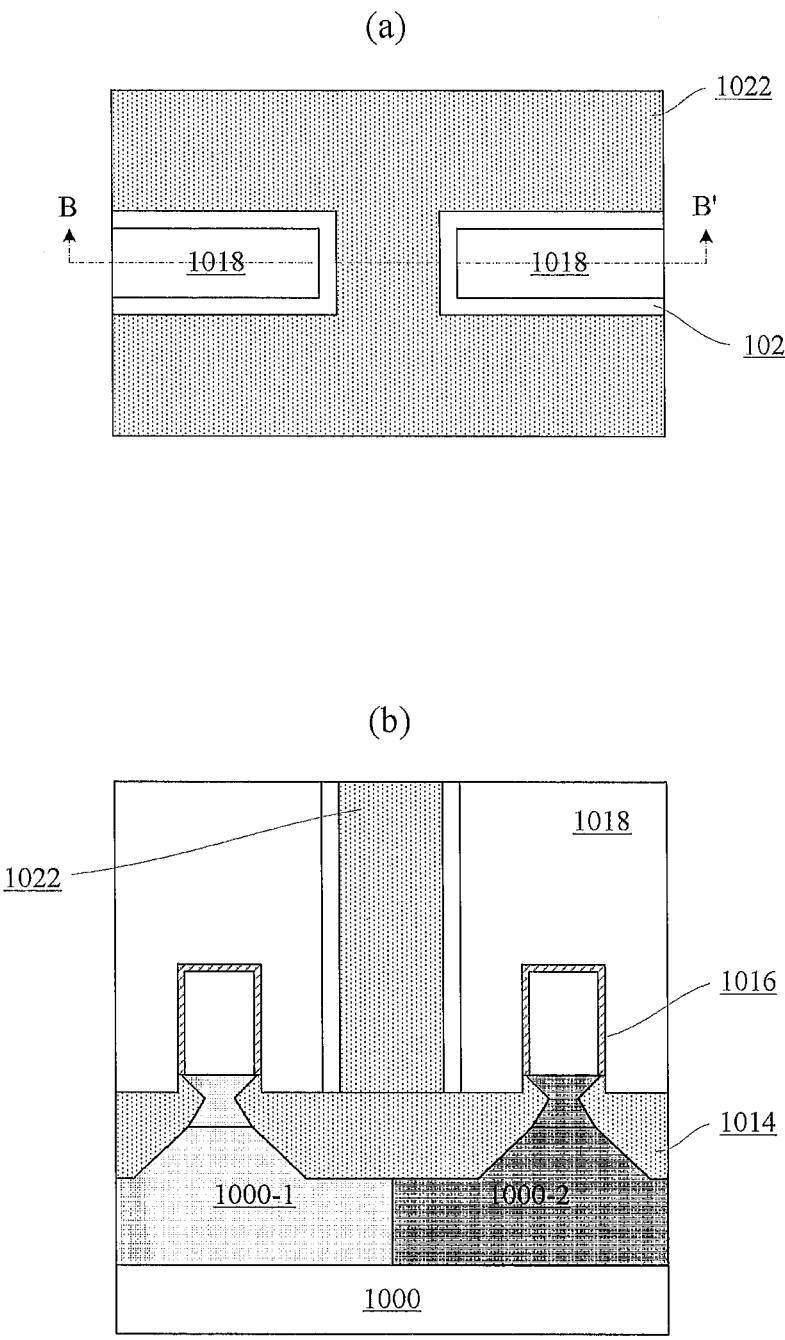

Next, as shown in FIG. 13 (FIG. 13(b) shows a cross-sectional view along line BB' in FIG. 13(a)), a further dielectric layer 1022 may be formed through, for example, deposition. The dielectric layer 1022 may comprise oxide, for example. Then, the dielectric layer 1022 is planarized by, for example, CMP, which may stop at the spacer 1020, thereby exposing the sacrifice gate conductor layer 1018.

Figure 14:
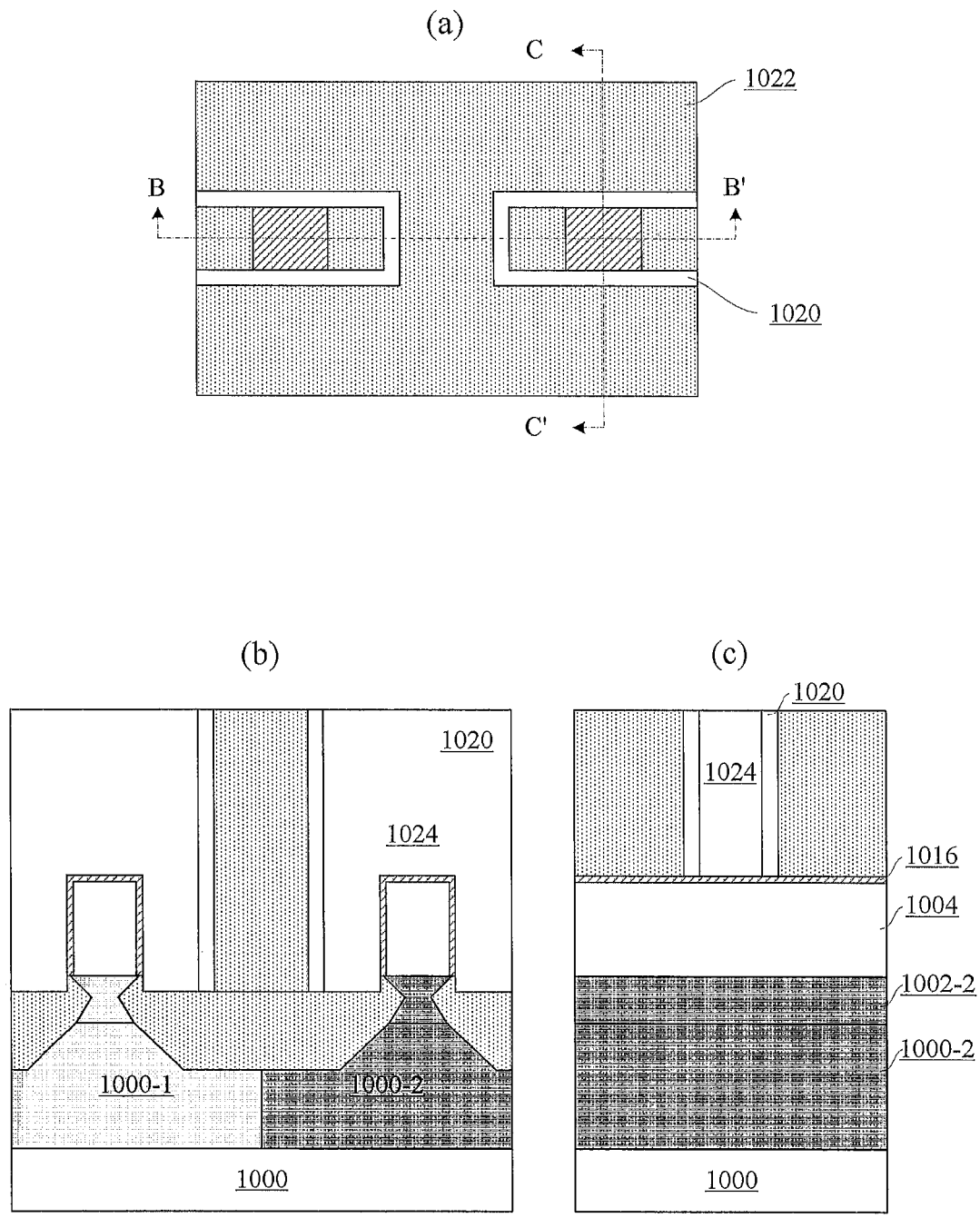

Subsequently, as shown in FIG. 14 (FIG. 14(b) shows a cross-sectional view along line BB' in FIG. 14(a), and FIG. 14(c) shows a cross-sectional view along line CC' in FIG. 14(a)), the sacrifice gate conductor layer 1018 may selectively removed by, for example, a TMAH solution, and thus a void 1024 is formed within the spacer 1020. In another example, the sacrifice gate dielectric layer 1016 may be further removed.

Figure 15:
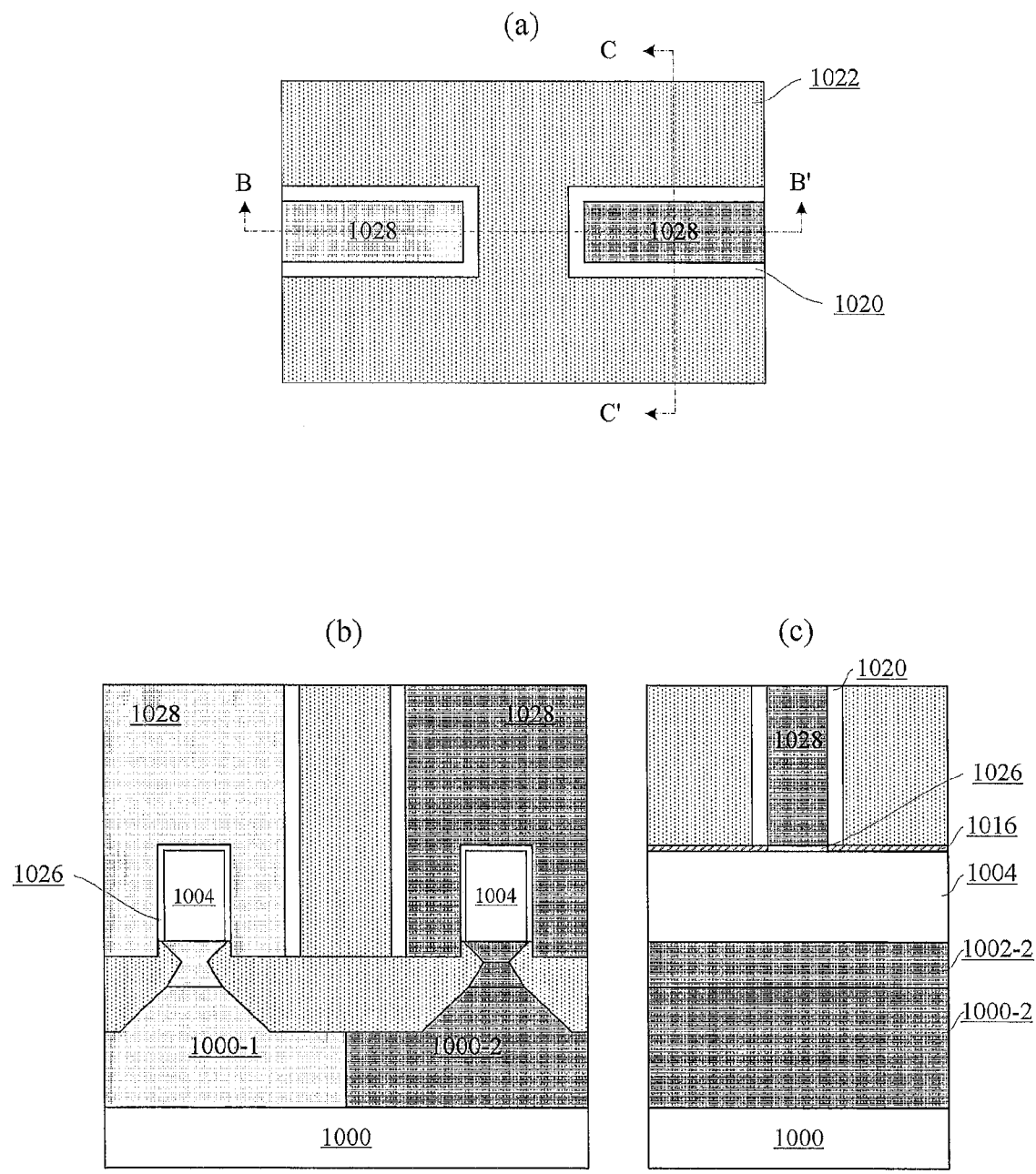

Next, as shown in FIG. 15 (FIG. 15(b) shows a cross-sectional view along line BB' in FIG. 15(a), and FIG. 15(c) shows a cross-sectional view along line CC' in FIG. 15(a)), a final gate stack is formed by forming a gate dielectric layer 1026 and a gate conductor layer 1028 in the void 1024. The gate dielectric layer 1026 may comprise a high-K gate dielectric, such as $HfO_2$, with a thickness of about 1-5 nm. The gate conductor layer 1028 may comprise a metal gate conductor. Further, a work function adjustment layer (not shown) may be formed between the gate dielectric layer 1022 and the gate conductor layer 1024.

Although the gate dielectric layer 1026 is shown in FIG. 15 as a thin layer at the bottom of the void 1024, the gate dielectric layer 1026 may be also formed on side walls of the void 1024 and thus surround the gate conductor layer 1028.

As such, the semiconductor device according to the embodiment is achieved. The structure of the semiconductor device is substantially the same as the semiconductor device of FIG. 11, except that the gate stack is formed in a different manner.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

The present disclosure is described above with reference to the embodiments thereof. However, those embodiments are provided just for illustrative purpose, rather than limiting the present disclosure. The scope of the disclosure is defined by the attached claims as well as equivalents thereof. Those skilled in the art can make various alternations and modifications without departing from the scope of the disclosure, which all fall within the scope of the disclosure.

I claim:

1. A method for manufacturing a semiconductor device, the method comprising:
   wherein a first semiconductor layer and a second semiconductor layer are formed sequentially on a substrate, patterning the second semiconductor layer to form an initial fin;
   performing anisotropic etching on the first semiconductor layer to form a Σ-shaped lateral recess therein;
   forming an isolation layer on the substrate, wherein the isolation layer has a portion that fills the lateral recess, and wherein the isolation layer, except the portion that fills the lateral recess, has a top surface located between a top surface and a bottom surface of the first semiconductor layer, and thus defines a fin above the isolation layer; and forming a gate stack intersecting the fin on the isolation layer.

2. The method according to claim 1, wherein performing anisotropic etching on the first semiconductor layer comprises:
etching the first semiconductor layer to form a C-shaped lateral recess therein; and
performing anisotropic etching on the first semiconductor layer through the C-shaped lateral recess to form the Σ-shaped lateral recess.

3. The method according to claim 2, wherein forming a C-shaped lateral recess comprises:
forming a non-crystallization region in the first semiconductor layer through ion implantation; and
removing the non-crystallization region to form the C-shaped lateral recess.

4. The method according to claim 1, further comprising, after forming the initial fin and before performing anisotropic etching on the first semiconductor layer, forming a protection layer on a side wall of the fin.

5. The method according to claim 1, further comprising, before patterning the initial fin, forming a protection layer on the second semiconductor layer.

6. The method according to claim 1, wherein forming an isolation layer comprises
depositing, on the substrate, a dielectric layer substantially covering the initial fin, wherein a portion of the dielectric layer on top of the initial fin has a thickness sufficiently less than that of a portion of the dielectric layer on the substrate; and
etching back the dielectric layer.

7. The method according to claim 6, wherein the portion of the dielectric layer on top of the initial fin has a thickness less than ⅓ of the thickness of the portion of the dielectric layer on the substrate.

8. The method according to claim 6, wherein the dielectric layer is formed by High Density Plasma (HDP) deposition.

9. The method according to claim 6, wherein a plurality of initial fins are formed on the substrate, and a portion of the dielectric layer on top of each of the initial fins has a thickness less than ½ of a spacing between the initial fin and its neighboring initial fin.

10. The method according to claim 1, wherein the first semiconductor layer is doped with n-type impurities for a p-type device, or is doped with p-type impurities for an n-type device.

11. A semiconductor device comprising:
a substrate;
patterned first and second semiconductor layers sequentially formed on the substrate, wherein the first semiconductor layer includes a Σ-shaped lateral recess relative to the second semiconductor layer;
an isolation layer formed on the substrate, wherein the isolation layer has a portion that fills the lateral recess, and wherein the isolation layer, except the portion that fills the lateral recess, has a top surface lower than a top surface of the first semiconductor layer but higher than a bottom surface of the first semiconductor layer, and thus defines a fin above the isolation layer; and
a gate stack formed on the isolation layer and intersecting the fin.

12. The semiconductor device according to claim 11, wherein
the substrate comprises bulk Si;
the first semiconductor layer comprises Si or SiGe, and is doped to form a punch-through stopper; and
the second semiconductor layer comprises Si.

13. The semiconductor device according to claim 12, wherein the first semiconductor layer is doped with n-type impurities for a p-type device, or is doped with p-type impurities for an n-type device.

14. The semiconductor device according to claim 11, wherein the semiconductor device comprises a plurality of fins, wherein the fins have their respective top surfaces substantially flush with each other, and the isolation layer has a substantially flat top surface.

* * * * *